United States Patent
Han et al.

(10) Patent No.: US 11,127,535 B2
(45) Date of Patent: Sep. 21, 2021

(54) FERROELECTRIC ENHANCED SOLAR CELL AND PREPARATION METHOD THEREOF

(71) Applicant: Huazhong University of Science and Technology, Wuhan (CN)

(72) Inventors: Hongwei Han, Wuhan (CN); Anyi Mei, Wuhan (CN); Shuang Liu, Wuhan (CN); Xiaolei Li, Wuhan (CN); Deyi Zhang, Wuhan (CN)

(73) Assignee: HUAZHONG UNIVERSITY OF SCIENCE AND TECHNOLOGY, Wuhan (CN)

( * ) Notice: Subject to any disclaimer, the term of this patent is extended or adjusted under 35 U.S.C. 154(b) by 0 days.

(21) Appl. No.: 16/655,271

(22) Filed: Oct. 17, 2019

(65) Prior Publication Data

US 2020/0051753 A1 Feb. 13, 2020

Related U.S. Application Data

(63) Continuation-in-part of application No. PCT/CN2018/099518, filed on Aug. 9, 2018.

(30) Foreign Application Priority Data

Oct. 24, 2017 (CN) .......................... 201710997549.6

(51) Int. Cl.
*H01L 31/00* (2006.01)
*H01G 9/20* (2006.01)
(Continued)

(52) U.S. Cl.
CPC ......... *H01G 9/2018* (2013.01); *H01G 9/0036* (2013.01); *H01G 9/2009* (2013.01);
(Continued)

(58) Field of Classification Search
CPC .. H01G 9/2018; H01G 9/0036; H01G 9/2009; H01L 51/0006; H01L 51/0028;
(Continued)

(56) References Cited

U.S. PATENT DOCUMENTS

2012/0017976 A1 1/2012 Nechache et al.
2013/0038267 A1 2/2013 Jiang et al.
(Continued)

FOREIGN PATENT DOCUMENTS

CN 104213250 A 12/2014
CN 104409636 A 3/2015
(Continued)

OTHER PUBLICATIONS

Ball et al., "Low-temperature processed meso-superstructured to thin-film perovskite solar cells," Energy Environ. Sci., 2013,6, 1739-1743 (Year: 2013).*
(Continued)

*Primary Examiner* — Angelo Trivisonno
(74) *Attorney, Agent, or Firm* — Matthias Scholl P.C.; Matthias Scholl

(57) ABSTRACT

A ferroelectric enhanced solar cell, including a conductive substrate, and a hole blocking layer, a mesoporous nanocrystalline layer, a mesoporous spacer layer and a mesoporous back electrode sequentially deposited in that order on the conductive substrate. The mesopores of at least one of the mesoporous nanocrystalline layer, the mesoporous spacer layer and the mesoporous back electrode are filled with a photoactive material. At least one of the hole blocking layer, the mesoporous nanocrystalline layer and the mesoporous spacer layer includes a ferroelectric material or a ferroelectric nanocomposite.

8 Claims, 1 Drawing Sheet

(51) Int. Cl.
*H01G 9/00* (2006.01)
*H01L 51/00* (2006.01)
*H01L 51/42* (2006.01)
*H01L 51/44* (2006.01)

(52) U.S. Cl.
CPC ...... *H01L 51/0006* (2013.01); *H01L 51/0028* (2013.01); *H01L 51/426* (2013.01); *H01L 51/4273* (2013.01); *H01L 51/441* (2013.01)

(58) Field of Classification Search
CPC . H01L 51/426; H01L 51/4273; H01L 51/441; H01L 51/4226; H01L 31/0352; H01L 31/03529; H01L 31/04; H01L 31/18; Y02E 10/549; Y02E 10/542
See application file for complete search history.

(56) References Cited

U.S. PATENT DOCUMENTS

| | | | | |
|---|---|---|---|---|
| 2013/0104969 | A1* | 5/2013 | Rappe | H01L 31/03529 136/255 |
| 2015/0243444 | A1 | 8/2015 | Irwin et al. | |
| 2016/0111575 | A1* | 4/2016 | Han | H01L 31/0384 136/258 |
| 2016/0293872 | A1 | 10/2016 | Ko et al. | |
| 2017/0213651 | A1* | 7/2017 | Wang | H01L 51/4226 |

FOREIGN PATENT DOCUMENTS

| | | | |
|---|---|---|---|
| CN | 105405973 | A | 3/2016 |
| CN | 105428438 | A | 3/2016 |
| CN | 106067515 | A | 11/2016 |
| CN | 106972064 | A | 7/2017 |
| JP | 201570003 | A | 4/2015 |
| JP | 2016-521016 | A | 7/2016 |
| JP | 2016-523453 | A | 8/2016 |
| KR | 101465435 | B1 | 11/2014 |
| WO | 2012070531 | A1 | 5/2012 |
| WO | 2016012987 | A1 | 1/2016 |

OTHER PUBLICATIONS

Mei et al., A hole-conductor-free, fully printable mesoscopic perovskite solar cell with high stability, Science, Jul. 18, 2014, pp. 295-298 Vol. 345, Issue 6194, American Association for the Advancement of Science, United States.

Ku et al.. Full printable processed mesoscopic CH3NH3PbI3/TiO2 heterojunction solar cells with carbon counter electrode. Scientific Reports, Nov. 4, 2013, p. 3132, vol. 3, Nature Research, United Kingdom.

Yuan et al., Efficiency enhancement in organic solar cells with ferroelectric polymers, Nature Materials, Apr. 2011, pp. 296-302, vol. 10, Nature Publishing Group, United Kingdom.

Nalwa et al. Enhanced charge separation in organic photovoltaic films doped with ferroelectric dipoles, Energy & Environmental Science, 2012, pp. 7042-7049, vol. 5, Royal Society of Chemistry, United Kingdom.

Xiao et al., Synthesis and application of ferroelectric P(VDF-TrFE) nanoparticles in organic photovoltaic devices for high efficiency, Advanced Energy Materials, 2013, pp. 1581-1588, vol. 3, Wiley, United States.

Yang et al., Tuning the energy level offset between donor and acceptor with ferroelectric dipole layers for increased afficiency in bilayer organic photovoltaic cells, Advanced Material, 2012, pp. 1455-1460, vol. 24, Wiley-VCH, Germany.

Yuan et al., Arising applications of ferroelectric materials in photovoltaic devices, Journal of Materials Chemistry A, 2014, pp. 6027-6041, vol. 2, Royal Society of Chemistry, United Kingdom.

Yuan et al., Understanding the effect of ferroelectric polarization on power conversion efficiency of organic photovoltaic devices, Energy & Environmental Science, 2012, pp. 8558-8563, vol. 5, Royal Society of Chemistry, United Kingdom.

* cited by examiner

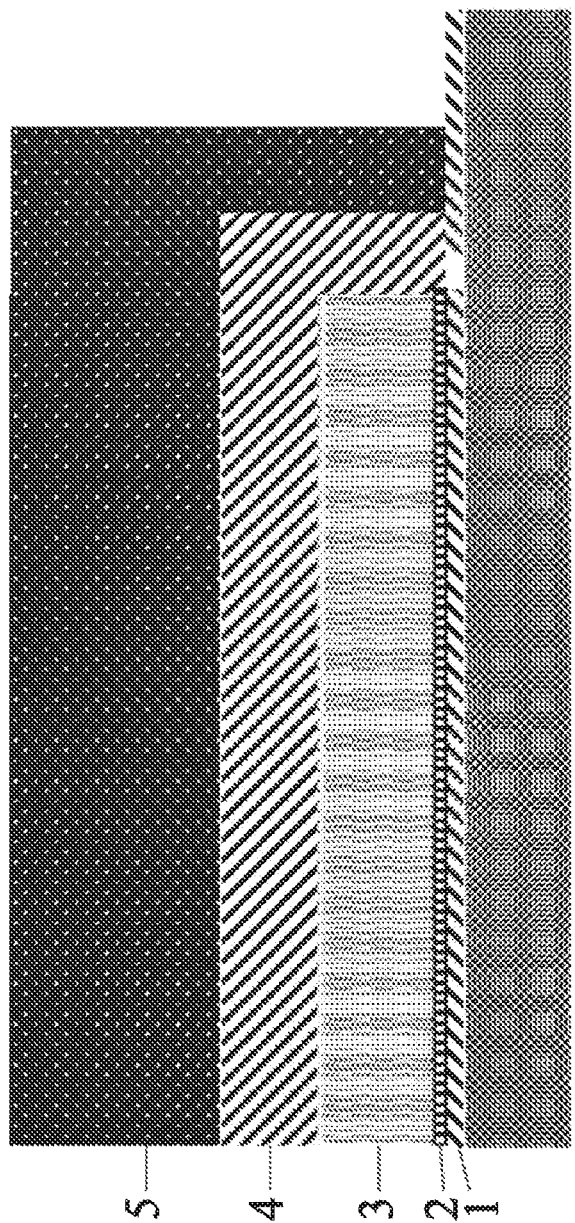

FERROELECTRIC ENHANCED SOLAR CELL AND PREPARATION METHOD THEREOF

CROSS-REFERENCE TO RELATED APPLICATIONS

This application is a continuation-in-part of International Patent Application No. PCT/CN2018/099518 with an international filing date of Aug. 9, 2018, designating the United States, now pending, and further claims foreign priority benefits to Chinese Patent Application No. 201710997549.6 filed Oct. 24, 2017. The contents of all of the aforementioned applications, including any intervening amendments thereto, are incorporated herein by reference. Inquiries from the public to applicants or assignees concerning this document or the related applications should be directed to: Matthias Scholl P. C., Attn.: Dr. Matthias Scholl Esq., 245 First Street, 18th Floor, Cambridge, Mass. 02142.

BACKGROUND

The disclosure relates to the technical field of solar cells, and more particularly to a ferroelectric enhanced solar cell and a preparation method thereof.

Although organic ferroelectric materials have been successfully applied in polymer solar cells, there are still many problems to be addressed. On the one hand, the insulating property of the ferroelectric material affects the charge transport inside the solar cells, and on the other hand, it is difficult to obtain an organic ferroelectric material with good crystallinity.

SUMMARY

The disclosure provides a ferroelectric enhanced solar cell and a preparation method thereof, in which by using a ferroelectric nanomaterial, such as nanoparticles, instead of a common film, high remanent polarization is obtained and the charge transport inside the solar cell is not affected. The inorganic ferroelectric material treated by the specific artificial polarization process can also effectively promote the excition separation and charge transport, and can effectively solve the problem that only organic ferroelectric materials are used and thus the performance of the solar cell is limited in the prior art. Further, in the disclosure, through utilizing the overall combination of materials (comprising specific material types and particle size requirements), shape parameters and the like of the respective layers of the ferroelectric enhanced solar cell, especially effectively controlling the mesoporous morphology of each mesoporous layer, the ferroelectric enhanced solar cell as a whole has a good photoelectric conversion effect.

According to one embodiment of the disclosure, there is provided a ferroelectric enhanced solar cell, comprising a conductive substrate, and a hole blocking layer, a mesoporous nanocrystalline layer, a mesoporous spacer layer and a mesoporous back electrode sequentially deposited in that order on the conductive substrate; at least one of the mesoporous nanocrystalline layer, the mesoporous spacer layer and the mesoporous back electrode is filled with a photoactive material in the mesopores; and at least one of the hole blocking layer, the mesoporous nanocrystalline layer and the mesoporous spacer layer comprises a ferroelectric material or a ferroelectric nanocomposite.

When the hole blocking layer comprises the ferroelectric material or the ferroelectric nanocomposite, the hole blocking layer has a thickness of not more than 100 nm; when the mesoporous nanocrystalline layer comprises the ferroelectric material or the ferroelectric nanocomposite, the mesoporous nanocrystalline layer has a thickness of 100 nm to 5000 nm: and when the mesoporous spacer layer comprises the ferroelectric material or the ferroelectric nanocomposite, the mesoporous spacer layer has a thickness of 100 nm to 5000 nm.

The ferroelectric material is a dielectric material having a ferroelectric effect. Preferably, the ferroelectric materials in the hole blocking layer and the mesoporous nanocrystalline layer are $BaSnO_3$, and the ferroelectric material in the mesoporous spacer layer is one or more of $CaTiO_3$, $BaTiO_3$, $PbZrO_3$, $PbTiO_3$, $PbZrO_3$, $ZnTiO_3$, $BaZrO_3$, $Pb(Zr_{1-x}Ti_x)O_3$, $(La_y Pb_{1-y})(Zr_{1-x}Ti_x)O_3$, $(1-x)[Pb(Mg_{1/3}Nb_{2/3})O_3]\cdot x[PbTiO_3]$, $BiFeO_3$, $Pb(Zn_{1/3}Nb_{2/3})O_3$, $Pb(Mg_{1/3}Nb_{2/3})O_3$, $(Na_{1/2}Bi_{1/2})TiO_3$, $(K_{1/2}Bi_{1/2})TiO_3$, $LiNbO_3$, $KNbO_3$, $KTaO_3$, $Pb(Sr_xTa_{1-x})O_3$ and $Ba_xSr_{1-x}TiO_3$; wherein x in $Pb(Zr_{1-x}Ti_x)O_3$ and $(1-x)[Pb(Mg_{1/3}Nb_{2/3})O_3]\cdot x[PbTiO_3]$ satisfies $0 \le x \le 1$; in $(La_yPb_{1-y})(Zr_{1-x}Ti_x)O_3$, x satisfies $0 \le x \le 1$, and y satisfies $0 \le y \le 1$; x in $Pb(Sr_xTa_{1-x})O_3$ satisfies $0 \le x \le 1$; x in $Ba_xSr_{1-x}TiO_3$ satisfies $0 \le x \le 1$; preferably, the ferroelectric material of the mesoporous nanocrystalline layer or the mesoporous spacer layer has a particle size of 5 to 200 nm.

The ferroelectric nanocomposite has a core-shell structure with ferroelectric material nanoparticles as a core and an insulating material as a shell. Preferably, the insulating material is at least one of $ZrO_2$, $Al_2O_3$ and $SiO_2$; the ferroelectric materials of the hole blocking layer and the mesoporous nanocrystalline layer are $BaSnO_3$, and the ferroelectric material of the mesoporous spacer layer is one or more of $CaTiO_3$, $BaTiO_3$, $PbZrO_3$, $PbTiO_3$, $PbZrO_3$, $ZnTiO_3$, $BaZrO_3$, $Pb(Zr_{1-x}Ti_x)O_3$, $(La_yPb_{1-y})(Zr_{1-x}Ti_x)O_3$, $(1-x)[Pb(Mg_{1/3}Nb_{2/3})O_3]\cdot x[PbTiO_3]$, $BiFeO_3$, $Pb(Zn_{1/3}Nb_{2/3})O_3$, $Pb(Mg_{1/3}Nb_{2/3})O_3$, $(Na_{1/2}Bi_{1/2})TiO_3$, $(K_{1/2}Bi_{1/2})TiO_3$, $LiNbO_3$, $KNbO_3$, $KTaO_3$, $Pb(Sr_xTa_{1-x})O_3$ and $Ba_xSr_{1-x}TiO_3$; wherein x in $Pb(Zr_{1-x}Ti_x)O_3$ and $(1-x)[Pb(Mg_{1/3}Nb_{2/3})O_3]\cdot x[PbTiO_3]$ satisfies $0 \le x \le 1$; in $(La_yPb_{1-y})(Zr_{1-x}Ti_x)O_3$, x satisfies $0 \le x \le 1$, and y satisfies $0 \le y \le 1$; x in $Pb(Sr_xTa_{1-x})O_3$ satisfies $0 \le x \le 1$; x in $Ba_xSr_{1-x}TiO_3$ satisfies $0 \le x \le 1$; preferably, the ferroelectric nanocomposite of the mesoporous nanocrystalline layer or the mesoporous spacer layer has a particle size of 5 to 200 nm.

The hole blocking layer is a film of inorganic oxide semiconductor material or a film of ferroelectric material; and the inorganic oxide semiconductor material is $TiO_2$, $ZnO$ or $SnO_2$.

The mesoporous nanocrystalline layer is a mesoporous $TiO_2$ nanocrystalline layer, a mesoporous ZnO nanocrystalline layer, a mesoporous $SnO_2$ nanocrystalline layer, a mesoporous ferroelectric material nanocrystalline layer or a mesoporous ferroelectric nanocomposite nanocrystalline layer; preferably, the mesoporous nanocrystalline layer is a mesoporous $BaSnO_3$ nanocrystalline layer.

The mesoporous spacer layer is a mesoporous $ZrO_2$ layer, a mesoporous $SiO_2$ layer, a mesoporous $Al_2O_3$ layer, a mesoporous ferroelectric material layer, or a mesoporous ferroelectric nanocomposite layer.

The photoactive material is a perovskite-type semiconductor material or a semiconductor material having a band gap of not more than 2 eV; the perovskite-type semiconductor material has a chemical formula of $ABX_3$, where A is at least one of methylamine, formamidine and an alkali metal element, B is at least one of lead and tin, and X is at least one of iodine, bromine and chlorine; preferably, the narrow band gap semiconductor material is at least one of Se, SbSe, and CdSe.

Also provided is a method for preparing the above ferroelectric enhanced solar cell, the method comprising:
(1) preparing a hole blocking layer on a conductive substrate;
(2) sequentially depositing a mesoporous nanocrystalline layer, a mesoporous spacer layer and a mesoporous back electrode layer on the hole blocking layer, and then performing sintering to obtain a solar cell frame structure;
(3) applying an applied electric field to the solar cell frame structure for polarization at 80 to 150° C., in which the applied electric field has an electric field intensity satisfying E≤10 kV/mm and a direction perpendicular to a plane of the conductive substrate and directed from the mesoporous nanocrystalline layer to the mesoporous back electrode layer; and
(4) applying a photoactive material precursor solution to the polarized solar cell frame structure obtained in (3) to fill the photoactive material precursor solution in mesopores of the mesoporous back electrode layer, the mesoporous spacer layer and the mesoporous nanocrystalline layer, and annealing them to remove a solvent in the precursor solution, thereby obtaining a ferroelectric enhanced solar cell.

As an improvement, in (2), the mesoporous back electrode layer is a mesoporous carbon electrode layer.

Advantages of the ferroelectric enhanced solar cell according to embodiments of the disclosure are summarized as follows:

In the disclosure, a ferroelectric material having ferroelectric properties or a core-shell nanocomposite comprising the ferroelectric material is used to form one or more of a hole blocking layer, a mesoporous nanocrystalline layer and a mesoporous spacer layer. When the ferroelectric material constitutes the hole blocking layer or the mesoporous nanocrystalline layer, taking $BaSnO_3$ as an example, it has a band position matched with the light absorbing material (especially a perovskite-type light absorbing material), and good electrical conductivity, and after artificial polarization, an oriented electric field is generated in $BaSnO_3$, which can further promote the charge separation and transport; when the ferroelectric material constitutes the mesoporous spacer layer, the ferroelectric material may be, for example, $BaTiO_3$, $Pb(Zr_{1-x}Ti_x)O_3$ and the like, which are all good inorganic insulating ferroelectric materials, have good insulating properties and thus can meet the requirements of the spacer layers of the solar cells. Meanwhile, after artificial polarization, an oriented electric field is generated in the ferroelectric material, which further facilitates the excition separation and charge transport.

In particular, the method further controls the polarization in the preparation process of the solar cell, in which the polarization environment temperature is controlled at 80 to 150° C., and the applied electric field is controlled to have an electric field intensity satisfying E≤10 kV/mm and a direction perpendicular to a plane of the conductive substrate and directed from the mesoporous nanocrystalline layer to the mesoporous back electrode layer, thereby ensuring the polarization effect of the ferroelectric material.

In summary, when a ferroelectric material or a core-shell nanocomposite comprising the ferroelectric material constitutes one or more of a hole blocking layer, a mesoporous nanocrystalline layer and a mesoporous spacer layer, it can block the transport of holes directly to the conductive substrate or serve as a photoactive material scaffold, and meanwhile, an oriented polarized electric field is generated in the mesoporous ferroelectric material layer after an electric field is applied at a certain temperature, which greatly improving the separation and transport efficiency of the electron-hole pairs, and thus improving the photoelectric conversion efficiency of the solar cell. In the disclosure, a ferroelectric material (comprising a ferroelectric nanocomposite) is introduced into a mesoporous nanocrystalline layer or a mesoporous spacer layer such that the ferroelectric material is used as a photoactive material scaffold, and meanwhile, through utilizing the ferroelectric effect of the ferroelectric material, an oriented electric field is generated in the ferroelectric material by polarization, which facilitates the separation and transport of charges in the photoactive layer, reduces recombination and transmission loss and thus improves the photoelectric conversion efficiency of the solar cell.

Accordingly, in the disclosure, the ferroelectric effect is utilized to facilitate the separation and transport of electrons and holes in the solar cell, thereby achieving higher photoelectric conversion efficiency. In the disclosure, the ferroelectric material is utilized to improve the separation and transport of electrons and holes in the entire solar cell with a simple fabrication process.

BRIEF DESCRIPTION OF THE DRAWINGS

The disclosure is described hereinbelow with reference to accompanying drawings, in which the sole FIGURE is a schematic structural diagram of a ferroelectric enhanced solar cell according to one embodiment of the disclosure.

In the drawings, the following reference number are used: 1: conductive substrate, 2: hole blocking layer, 3: nanocrystalline layer, 4: mesoporous spacer layer, 5: mesoporous back electrode.

DETAILED DESCRIPTION

To further illustrate, embodiments detailing a ferroelectric enhanced solar cell and a preparation method thereof are described below. It should be noted that the following embodiments are intended to describe and not to limit the disclosure.

EXAMPLE 1

Perovskite Solar Cell with a Mesoporous Spacer Layer Comprising $Pb(Zr_xTi_{1-x})O_3$ In the device, a conductive glass (such as a transparent conductive glass, for example, FTO) was used as a conductive substrate 1, and after a dense titanium dioxide layer 2 with a thickness of 50 nm was deposited on the conductive substrate 1, a titanium dioxide nanocrystalline layer 3, a mesoporous spacer layer 4 and a mesoporous back electrode 5 were sequentially deposited on the dense titanium dioxide layer 2 from bottom to top by screen printing and sintering (for example, 500° C.). Then, a positive electrode was connected to the FTO conductive substrate, and a negative electrode was connected to the mesoporous back electrode. Under the condition that the electric field has a field intensity of, for example, 2.5 kV/mm and a direction directed from the conductive substrate to the mesoporous back electrode layer, polarization was performed at 80° C. for a period of time (for example, 20 min).

The titanium dioxide nanocrystalline layer may have a grain size of 18 nm and a thickness of about 1 µm, and may also has a grain size of 20 nm and a thickness of about 1 µm, for example. The mesoporous spacer layer is a $Pb(Zr_xTi_{1-x})O_3$ mesoporous spacer layer (x may take any value in the range of 0 to 1) or a $ZrO_2$ mesoporous spacer layer. A slurry having a certain viscosity was prepared by mixing uniform stable $Pb(Zr_xTi_{1-x})O_3$ nanoparticles (having a particle size of, for example, 30 nm) or $ZrO_2$ nanoparticles (having a particle size of, for example, 30 nm) with ethyl cellulose and terpineol in a mass ratio of 1:1:5, and then sintered (at, for example, 400 to 500° C.) after screen printing to remove the ethyl cellulose so as to obtain a film with a mesoporous structure, thereby forming a mesoporous spacer layer having a thickness of, for example, about 1 μm. The mesoporous back electrode is a mesoporous conductive film comprising graphite or carbon black, and has a thickness of, for example, about 10 μm. A certain amount (for example, 4 μL) of lead iodide methylamine ($CH_3NH_3PbI_3$) precursor solution (30 wt %) was applied dropwise onto the mesoporous back electrode, allowed to stand for 10 minutes, and then dried at, for example, 100° C. The test shows that under simulated sunlight of 100 mW*$cm^{-2}$, when the mesoporous spacer layer is made of $Pb(Zr_xTi_{1-x})O_3$, the photoelectric conversion efficiency of the unpolarized device is 9.77% and the photoelectric conversion efficiency of the polarized device is 11.03%; when the mesoporous spacer layer is made of $ZrO_2$, the photoelectric conversion efficiencies of the unpolarized and polarized devices are respectively 8.54% and 8.51%.

EXAMPLE 2

Perovskite Solar Cell with a Mesoporous Nanocrystalline Layer Comprising $BaSnO_3$ In the device, a conductive glass was used as a conductive substrate 1, and after a dense titanium dioxide layer 2 with a thickness of, for example, 50 nm was deposited on the conductive substrate 1, a nanocrystalline layer 3, a mesoporous spacer layer 4 and a mesoporous back electrode 5 were sequentially deposited on the dense titanium dioxide layer 2 from bottom to top by screen printing and sintering (for example, 400° C.). Then, a positive electrode was connected to the FTO conductive substrate, a negative electrode was connected to the mesoporous back electrode. Under the condition that the electric field has a field intensity of, for example, 1.5 kV/mm, polarization was performed at 80° C. for a period of time (for example, 20 min) (the higher the temperature of the polarization environment, the smaller the required polarization field intensity).

The mesoporous nanocrystalline layer is a $BaSnO_3$ mesoporous nanocrystalline layer or a $TiO_2$ mesoporous nanocrystalline layer. A slurry having a certain viscosity was prepared by mixing uniform stable $BaSnO_3$ nanoparticles (having a particle size of, for example, 30 nm) or $TiO_2$ nanoparticles (having a particle size of, for example, 30 nm) with ethyl cellulose and terpineol in a mass ratio of 1:2:7, and then sintered after screen printing to form a film with a thickness of, for example, about 800 nm. The mesoporous spacer layer has a $ZrO_2$ grain size of 20 nm and a thickness of about 2 μm, for example. The mesoporous back electrode is a mesoporous conductive film comprising graphite or carbon black, and has a thickness of, for example, about 10 μm. A certain amount (for example, 4 μL) of lead iodide methylamine ($CH_3NH_3PbI_3$) precursor solution (30 wt %) was applied dropwise onto the mesoporous back electrode, allowed to stand for 10 minutes, and then dried at, for example, 100° C. The test shows that under simulated sunlight of 100 mW*$cm^{-2}$, when the mesoporous nanocrystalline layer is made of $BaSnO_3$, the photoelectric conversion efficiency of the unpolarized device is 10.60% and the photoelectric conversion efficiency of the polarized device is 11.34%; when the mesoporous spacer layer is made of $TiO_2$, the photoelectric conversion efficiencies of the unpolarized and polarized devices are respectively 10.10% and 10.15%.

EXAMPLE 3

Perovskite Solar Cell with a Mesoporous Nanocrystalline Layer Comprising $BaSnO_3$ and a Mesoporous Spacer Layer Comprising $Pb(Zr_xTi_{1-x})O_3$ In the device, a conductive glass was used as a conductive substrate 1, and after a dense titanium dioxide layer 2 with a thickness of, for example, 30 nm was deposited on the conductive substrate 1, a $BaSnO_3$ nanocrystalline layer 3, a $Pb(Zr_xTi_{1-x})O_3$ mesoporous spacer layer 4 and a mesoporous back electrode 5 were sequentially deposited on the dense titanium dioxide layer 2 from bottom to top by screen printing and sintering (for example, 500° C.). Then, a positive electrode was connected to the FTO conductive substrate, and a negative electrode was connected to the mesoporous back electrode. Under the condition that the electric field has a field intensity of, for example, 4.5 kV/mm, polarization was performed at 120° C. for a period of time (for example, 20 min).

A slurry having a certain viscosity was prepared by mixing uniform stable $BaSnO_3$ nanoparticles (having a particle size of, for example, 30 nm) with ethyl cellulose and terpineol in a mass ratio of 1:2:7, and then sintered after screen printing to form a $BaSnO_3$ mesoporous nanocrystalline layer with a thickness of, for example, about 800 nm. A slurry having a certain viscosity was prepared by mixing uniform stable $Pb(Zr_xTi_{1-x})O_3$ nanoparticles (having a particle size of, for example, 30 nm) with ethyl cellulose and terpineol in a mass ratio of 1:1:5, and then sintered after screen printing to form a $Pb(Zr_xTi_{1-x})O_3$ mesoporous nanocrystalline layer with a thickness of, for example, about 1 μm. The mesoporous back electrode is a mesoporous conductive film comprising graphite or carbon black, and has a thickness of, for example, about 10 μm. A certain amount (for example, 4 μL) of lead iodide methylamine ($CH_3NH_3PbI_3$) precursor solution (30 wt %) was applied dropwise onto the mesoporous back electrode, allowed to stand for 10 minutes, and then dried at, for example, 100° C. The test shows that under simulated sunlight of 100 mW*$cm^{-2}$, the photoelectric conversion efficiency of the unpolarized device is 10.06% and the photoelectric conversion efficiency of the polarized device is 11.76%.

EXAMPLE 4

Perovskite Solar Cell with a Mesoporous Spacer Layer Comprising $ZrO_2$ Wrapped $Pb(Zr_xTi_{1-x})O_3$ Nanocomposite In the device, a conductive glass was used as a conductive substrate 1, and after a dense titanium dioxide layer 2 with a thickness of, for example, 50 nm was deposited on the conductive substrate 1, a titanium dioxide nanocrystalline layer 3, a $ZrO_2$ wrapped $Pb(Zr_xTi_{1-x})O_3$ mesoporous spacer layer 4 and a mesoporous back electrode 5 were sequentially deposited on the dense titanium dioxide layer 2 from bottom to top by screen printing and sintering (for example, 500° C.). Then, a positive electrode was connected to the FTO conductive substrate, and a negative electrode was connected to the mesoporous back electrode. Under the condition that the electric field has a field intensity of, for example, 3.5 kV/mm, polarization was performed at 200° C. for a period of time (for example, 20 min).

The titanium dioxide nanocrystalline layer may have a grain size of 18 nm and a thickness of about 1 μm, and may also has a grain size of 20 nm and a thickness of 800 nm, for example. The mesoporous spacer layer is a $ZrO_2$ wrapped $Pb(Zr_xTi_{1-x})O_3$ mesoporous spacer layer or a $ZrO_2$ mesoporous spacer layer. A slurry having a certain viscosity was prepared by mixing uniform stable $ZrO_2$ wrapped $Pb(Zr_xTi_{1-x})O_3$ nanocomposite particles (i.e., core-shell composite particles with $ZrO_2$ as a shell and $Pb(Zr_xTi_{1-x})O_3$ as a core, the particle size of the core-shell composite particle as a whole is 30 nm) or $ZrO_2$ nanoparticles (having a particle size of, for example, 30 nm) with ethyl cellulose and terpineol in a mass ratio of 1:1:5, and then sintered after screen printing to form a mesoporous spacer layer with a thickness of, for example, about 2 μm. The mesoporous back electrode is a mesoporous conductive film comprising graphite or carbon black, and has a thickness of, for example, about 10 μm. A certain amount (for example, 4 μL) of lead iodide methylamine ($CH_3NH_3PbI_3$) precursor solution (30 wt %) was applied dropwise to the mesoporous back electrode, allowed to stand for 10 minutes, and then dried at, for example, 100° C. The test shows that under simulated sunlight of 100 mW*$cm^{-2}$, when the mesoporous spacer layer is made of $ZrO_2$ wrapped $Pb(Zr_xTi_{1-x})O_3$, the photoelectric conversion efficiency of the unpolarized device is 9.56% and the photoelectric conversion efficiency of the polarized device is 11.77%; when the mesoporous spacer layer is made of $ZrO_2$, the photoelectric conversion efficiencies of the unpolarized and polarized devices are respectively 8.54% and 8.51%.

In each of the above embodiments, the conductive substrate may preferably be a conductive glass or a conductive plastic, and the hole blocking layer 2 is an inorganic oxide film having good hole blocking ability, and is preferably a dense titanium oxide film or a tin oxide film which preferably has a thickness of 30 nm. However, the hole blocking layer 2 is not limited to the above two films, and its thickness can be adjusted as needed (for example, 10 to 50 nm). The material of the mesoporous nanocrystalline layer 3 comprises at least one of $TiO_2$, $ZnO$, $SnO_2$, $BaSnO_3$, $BaTiO_3$, $(Na_xBi_{1-x})TiO_3$, $(K_xBi_{1-x})TiO_3$ and a nanocomposite comprising the above materials, the grain size is not limited to 18 nm or 30 nm and may be selected as needed (for example, 20 to 100 nm), and the thickness is also not limited to that in the above embodiments (for example, 0.5 to 2 μm). The material of the mesoporous spacer layer comprises one or more of $ZrO_2$, $SiO_2$, $Al_2O_3$, $CaTiO_3$, $BaTiO_3$, $PbZrO_3$, $PbTiO_3$, $PbZrO_3$, $ZnTiO_3$, $BaZrO_3$, $Pb(Zr_{1-x}Ti_x)O_3$, $(La_yPb_{1-y})(Zr_{1-x}Ti_x)O_3$, $(1-x)[Pb(Mg_{1/3}Nb_{2/3})O_3] \cdot x[PbTiO_3]$, $BiFeO_3$, $Pb(Zn_{1/3}Nb_{2/3})O_3$, $Pb(Mg_{1/3}Nb_{2/3})O_3$, $(Na_{1/2}Bi_{1/2})TiO_3$, $(K_{1/2}Bi_{1/2})TiO_3$, $LiNbO_3$, $KNbO_3$, $KTaO_3$, $Pb(Sr_xTa_{1-x})O_3$, $Ba_xSr_{1-x}TiO_3$ and a nanocomposite comprising the above materials, the particle size is not limited to that in the above embodiments and may be selected as needed (for example, 10 to 100 nm), and the thickness can also be adjusted in a range of 1 to 4 μm. The mesoporous back electrode 5 is preferably a carbon electrode or comprising high work function material such as indium tin oxide, but not limited to the above two types of back electrodes. The photoactive material is not limited to the perovskite-type semiconductor material of lead iodide methylamine ($CH_3NH_3PbI_3$) given in the embodiments, and all perovskite-type photoactive materials with the general formula $ABX_3$ satisfy the conditions, wherein A is at least one of methylamine, formamidine and an alkali metal element, B is at least one of lead and tin, and X is at least one of iodine, bromine and chlorine; narrow band gap photoactive materials such as Se, SbSe and CdSe are also comprised, in addition to the perovskite-type photoactive materials.

The mesoporous material, the nanocrystalline material and the like in the disclosure satisfy the conventional definition in the art, that is, the mesoporous material refers to a kind of porous material having a pore diameter of 2 to 100 nm, and the nanocrystalline material refers to a nanomaterial having a crystal structure and a size of 1 to 100 nm.

In the above embodiments, sintering may be conducted once for deposition of each layer, or sintering may be conducted once for deposition of multiple layers (such as two or more layers). For example, sintering is performed once when the mesoporous nanocrystalline layer is deposited, and then sintering is performed once when the mesoporous spacer layer and the mesoporous back electrode layer are deposited. The ambient temperature at which the polarization is carried out, as well as the magnitude and direction of the electric field intensity of the applied electric field, may be flexibly adjusted according to actual conditions (such as the thickness and type of the ferroelectric material layer), as long as the ambient temperature is 80° C. to 150° C., the electric field intensity satisfies $E \leq 10$ kV/mm, and the direction of the electric field is perpendicular to the plane of the conductive substrate and directed from the mesoporous nanocrystalline layer to the mesoporous back electrode layer.

The photoactive material in the disclosure may be a light absorbing semiconductor material, and may also be an organic material having photosensitive properties (corresponding to an organic solar cell), a photosensitive dye (corresponding to a dye-sensitized solar cell) or the like, in addition to the perovskite-type semiconductor material (corresponding to a perovskite solar cell). In the preparation process, the photoactive material precursor solution may be applied dropwise onto the frame structure of the polarized solar cell (i.e., applied dropwise onto the polarized mesoporous back electrode layer), so that the precursor solution is sequentially filled in nanopores of the mesoporous back electrode, the mesoporous spacer layer and the mesoporous nanocrystalline layer from top to bottom. Taking a mesoporous nanocrystalline layer filled with a photoactive material as an example, after being filled with a photoactive material (such as a perovskite-type semiconductor material or a narrow band gap semiconductor material), the mesoporous nanocrystalline layer becomes a photoactive layer. The dense hole blocking layer (i.e., an electron transport layer) may be, for example, a dense titanium oxide film, a dense tin oxide film, a dense zinc oxide film, or a dense ferroelectric material or ferroelectric nanocomposite film.

In the ferroelectric enhanced solar cell of the disclosure, at least one of the hole blocking layer, the mesoporous nanocrystalline layer and the mesoporous spacer layer is composed of a ferroelectric material or a ferroelectric nanocomposite. In addition to the specific settings in the above embodiments, the thickness of each layer may be adjusted according to the needs of the cell; preferably, the hole blocking layer composed of the ferroelectric material or the ferroelectric nanocomposite has a thickness of not more than 100 nm (particularly preferably not more than 50 nm), the mesoporous nanocrystalline layer composed of the ferroelectric material or the ferroelectric nanocomposite has a thickness of 100 nm to 5000 nm (particularly preferably 500 nm to 1000 nm); the mesoporous spacer layer composed of the ferroelectric material or the ferroelectric nanocomposite has a thickness of 100 nm to 5000 nm (particularly preferably from 1 to 3 μm). It is possible to introduce a hole blocking layer, a mesoporous nanocrystalline layer or a mesoporous spacer layer composed of a ferroelectric material or a ferroelectric nanocomposite, and the preparation methods thereof can be obtained referring to the prior art, in which parameter conditions in the preparation methods can also be flexibly adjusted according to the thickness requirements of the respective layers. In the ferroelectric enhanced solar cell, the overall energy band structure needs to meet the requirements in the overall energy band of the solar cell in the prior art. Taking the spacer layer as an example, the purpose of the spacer layer is to prevent electrons from being transmitted to the mesoporous back electrode. Therefore, the conduction band of the material of the spacer layer should be higher than that of the photoactive material (such as a perovskite-type photoactive material), and in the ferroelectric material in the disclosure, such as $Pb(Zr_{1-x}Ti_x)O_3$, $(1-x)[Pb(Mg_{1/3}Nb_{2/3})O_3] \cdot x[PbTiO_3]$ and the like, x ranges from 0 to 1, which satisfies the energy band requirements of the corresponding ferroelectric material as the spacer layer. A separate dense ferroelectric material film can be used as a hole blocking layer. For example, in a case where the photoactive material is a perovskite-type semiconductor material, when a ferroelectric material has a suitable energy band (that is, the conduction band is lower than that of the perovskite-type light absorbing material, and the valence band is also lower than that of the perovskite-type light absorbing material), and also has good electrical conductivity, this ferroelectric material can be used as a hole blocking layer and an electron transport layer; for example, the $BaSnO_3$ ferroelectric material can be deposited into a very thin dense film to serve as a hole blocking layer. In the disclosure, the ferroelectric material and the ferroelectric nanocomposite (that is, a composite having a core-shell structure with ferroelectric material nanoparticles as the core and the insulating material as the shell) preferably have a particle diameter of 5 to 200 nm (more preferably 20 to 50 nm), to form a spacer layer or a nanocrystalline layer having a mesoporous structure.

It will be obvious to those skilled in the art that changes and modifications may be made, and therefore, the aim in the appended claims is to cover all such changes and modifications.

What is claimed is:

1. A solar cell, comprising:
a conductive substrate; and
a hole blocking layer, a mesoporous nanocrystalline layer, a mesoporous spacer layer and a mesoporous back electrode which are sequentially deposited in that order on the conductive substrate;
wherein:
mesopores of at least one of the mesoporous nanocrystalline layer, the mesoporous spacer layer and the mesoporous back electrode are filled with a photoactive material; and
at least one of the hole blocking layer, the mesoporous nanocrystalline layer and the mesoporous spacer layer comprises a ferroelectric material or a ferroelectric nanocomposite.

2. The solar cell of claim 1, wherein:
when the hole blocking layer comprises the ferroelectric material or the ferroelectric nanocomposite, the hole blocking layer has a thickness of not more than 100 nm;
when the mesoporous nanocrystalline layer comprises the ferroelectric material or the ferroelectric nanocomposite, the mesoporous nanocrystalline layer has a thickness of 100 nm to 5000 nm; and
when the mesoporous spacer layer comprises the ferroelectric material or the ferroelectric nanocomposite, the mesoporous spacer layer has a thickness of 100 nm to 5000 nm.

3. The solar cell of claim 1, wherein the ferroelectric material is a dielectric material; the ferroelectric materials in the hole blocking layer and the mesoporous nanocrystalline layer are $BaSnO_3$, and the ferroelectric material in the mesoporous spacer layer is one or more of $CaTiO_3$, $BaTiO_3$, $PbZrO_3$, $PbTiO_3$, $PbZrO_3$, $ZnTiO_3$, $BaZrO_3$, $Pb(Zr_{1-x}Ti_x)O_3$, $(La_yPb_{1-y})(Zr_{1-x}Ti_x)O_3$, $(1-x)[Pb(Mg_{1/3}Nb_{2/3})O_3] \cdot x[PbTiO_3]$, $BiFeO_3$, $Pb(Zn_{1/3}Nb_{2/3})O_3$, $Pb(Mg_{1/3}Nb_{2/3})O_3$, $(Na_{1/2}Bi_{1/2})TiO_3$, $(K_{1/2}Bi_{1/2})TiO_3$, $LiNbO_3$, $KNbO_3$, $KTaO_3$, $Pb(Sr_xTa_{1-x})O_3$ and $Ba_xSr_{1-x}TiO_3$; wherein x in $Pb(Zr_{1-x}Ti_x)O_3$ and $(1-x)[Pb(Mg_{1/3}Nb_{2/3})O_3] \cdot x[PbTiO_3]$ satisfies $0 \leq x \leq 1$; in $(La_yPb_{1-y})(Zr_{1-x}Ti_x)O_3$, x satisfies $0 \leq x \leq 1$, and y satisfies $0 \leq y \leq 1$; x in $Pb(Sr_xTa_{1-x})O_3$ satisfies $0 \leq x \leq 1$; x in $Ba_xSr_{1-x}TiO_3$ satisfies $0 \leq x \leq 1$; and the ferroelectric material of the mesoporous nanocrystalline layer or the mesoporous spacer layer has a particle size of 5 to 200 nm.

4. The solar cell of claim 1, wherein the ferroelectric nanocomposite has a core-shell structure with ferroelectric material nanoparticles as a core and an insulating material as a shell; the insulating material is at least one of $ZrO_2$, $Al_2O_3$ and $SiO_2$; the ferroelectric materials of the hole blocking layer and the mesoporous nanocrystalline layer are $BaSnO_3$, and the ferroelectric material of the mesoporous spacer layer is one or more of $CaTiO_3$, $BaTiO_3$, $PbZrO_3$, $PbTiO_3$, $PbZrO_3$, $ZnTiO_3$, $BaZrO_3$, $Pb(Zr_{1-x}Ti_x)O_3$, $(La_yPb_{1-y})(Zr_{1-x}Ti_x)O_3$, $(1-x)[Pb(Mg_{1/3}Nb_{2/3})O_3] \cdot x[PbTiO_3]$, $BiFeO_3$, $Pb(Zn_{1/3}Nb_{2/3})O_3$, $Pb(Mg_{1/3}Nb_{2/3})O_3$, $(Na_{1/2}Bi_{1/2})TiO_3$, $(K_{1/2}Bi_{1/2})TiO_3$, $LiNbO_3$, $KNbO_3$, $KTaO_3$, $Pb(Sr_xTa_{1-x})O_3$ and $Ba_xSr_{1-x}TiO_3$; wherein x in $Pb(Zr_{1-x}Ti_x)O_3$ and $(1-x)[Pb(Mg_{1/3}Nb_{2/3})O_3] \cdot x[PbTiO_3]$ satisfies $0 \leq x \leq 1$; in $(La_yPb_{1-y})(Zr_{1-x}Ti_x)O_3$, x satisfies $0 \leq x \leq 1$, and y satisfies $0 \leq y \leq 1$; x in $Pb(Sr_xTa_{1-x})O_3$ satisfies $0 \leq x \leq 1$; x in $Ba_xSr_{1-x}TiO_3$ satisfies $0 \leq x \leq 1$; and the ferroelectric nanocomposite of the mesoporous nanocrystalline layer or the mesoporous spacer layer has a particle size of 5 to 200 nm.

5. The solar cell of claim 1, wherein the hole blocking layer is a film of inorganic oxide semiconductor material or a film of ferroelectric material; and the inorganic oxide semiconductor material is $TiO_2$, $ZnO$ or $SnO_2$.

6. The solar cell of claim 1, wherein the mesoporous nanocrystalline layer is a mesoporous $TiO_2$ nanocrystalline layer, a mesoporous $ZnO$ nanocrystalline layer, a mesoporous $SnO_2$ nanocrystalline layer, a mesoporous ferroelectric material nanocrystalline layer or a mesoporous ferroelectric nanocomposite nanocrystalline layer; and the mesoporous nanocrystalline layer is a mesoporous $BaSnO_3$ nanocrystalline layer.

7. The solar cell of claim 1, wherein the mesoporous spacer layer is a mesoporous $ZrO_2$ layer, a mesoporous $SiO_2$ layer, a mesoporous $Al_2O_3$ layer, a mesoporous ferroelectric material layer, or a mesoporous ferroelectric nanocomposite layer.

8. The solar cell of claim 1, wherein the photoactive material is a perovskite-type semiconductor material or a semiconductor material having a band gap of not more than 2 eV; the perovskite-type semiconductor material has a chemical formula of $ABX_3$, where A is at least one of methylamine, formamidine and an alkali metal element, B is at least one of lead and tin, and X is at least one of iodine, bromine and chlorine; the narrow band gap semiconductor material is at least one of Se, SbSe, and CdSe.

* * * * *